United States Patent
Li et al.

(10) Patent No.: US 10,636,750 B1
(45) Date of Patent: Apr. 28, 2020

(54) STEP PYRAMID SHAPED STRUCTURE TO REDUCE DICING DEFECTS

(71) Applicant: INTERNATIONAL BUSINESS MACHINES CORPORATION, Armonk, NY (US)

(72) Inventors: Shidong Li, Poughkeepsie, NY (US); Kirk D. Peterson, Jericho, VT (US); Nicolas Pizzuti, Waterbury, VT (US); Thomas M. Shaw, Peekskill, NY (US); Thomas A. Wassick, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/160,224

(22) Filed: Oct. 15, 2018

(51) Int. Cl.
*H01L 21/78* (2006.01)
*H01L 23/544* (2006.01)
*H01L 23/00* (2006.01)

(52) U.S. Cl.
CPC .......... *H01L 23/562* (2013.01); *H01L 21/78* (2013.01); *H01L 23/544* (2013.01); *H01L 2223/5446* (2013.01)

(58) Field of Classification Search
CPC .............. H01L 23/554; H01L 23/562; H01L 2223/5446; H01L 21/78
See application file for complete search history.

(56) References Cited

U.S. PATENT DOCUMENTS

| | | | |
|---|---|---|---|
| 6,022,791 A | 2/2000 | Cook et al. | |
| 6,365,958 B1 | 4/2002 | Ibnabdeljajil et al. | |
| 6,495,918 B1 | 12/2002 | Brintzinger | |
| 7,741,715 B2 | 6/2010 | Kim et al. | |
| 8,048,761 B2 | 11/2011 | Yeo et al. | |
| 8,124,448 B2 | 2/2012 | Hudson | |
| 2004/0129938 A1* | 7/2004 | Landers | H01L 22/34 257/48 |
| 2013/0200528 A1 | 8/2013 | Lin et al. | |

\* cited by examiner

*Primary Examiner* — Robert G Bachner
*Assistant Examiner* — Molly K Reida
(74) *Attorney, Agent, or Firm* — Law Offices of Ira D. Blecker, P.C.

(57) ABSTRACT

A semiconductor device which includes a substrate having integrated circuits; and metallization layers on the substrate, the metallization layers having a peripheral region adjacent to a kerf region of the semiconductor device and containing a crack stop structure. The crack stop structure includes a bottom portion containing a plurality of the metallization layers connected by vias with each metallization layer decreasing in width in a step pyramid structure from a bottom of the bottom portion to a top of the bottom portion; and a top portion containing a top metallization layer of the metallization layers connected to the bottom portion, the top metallization layer being wider than a top-most metallization layer of the bottom portion and having a segment that extends toward the kerf region so as to create an overhang with respect to the bottom portion.

18 Claims, 4 Drawing Sheets

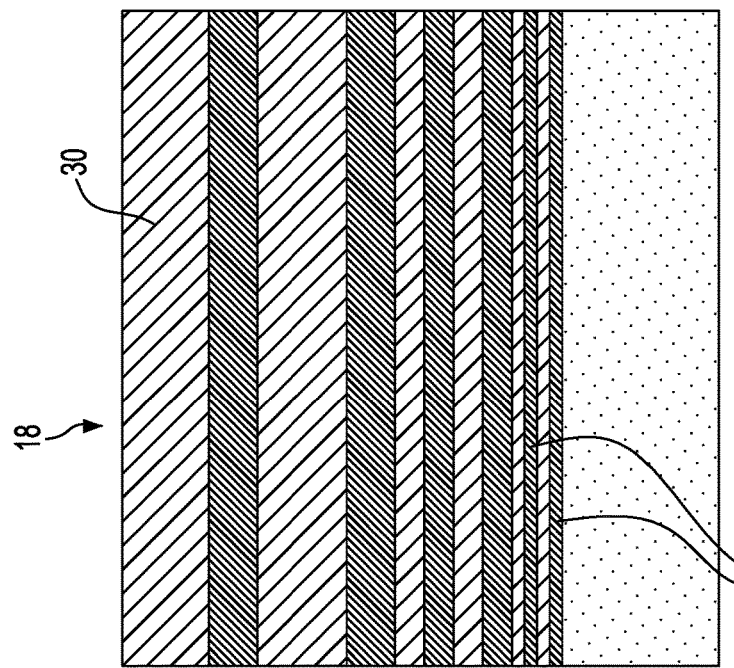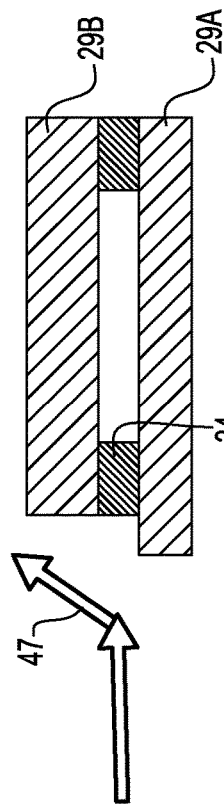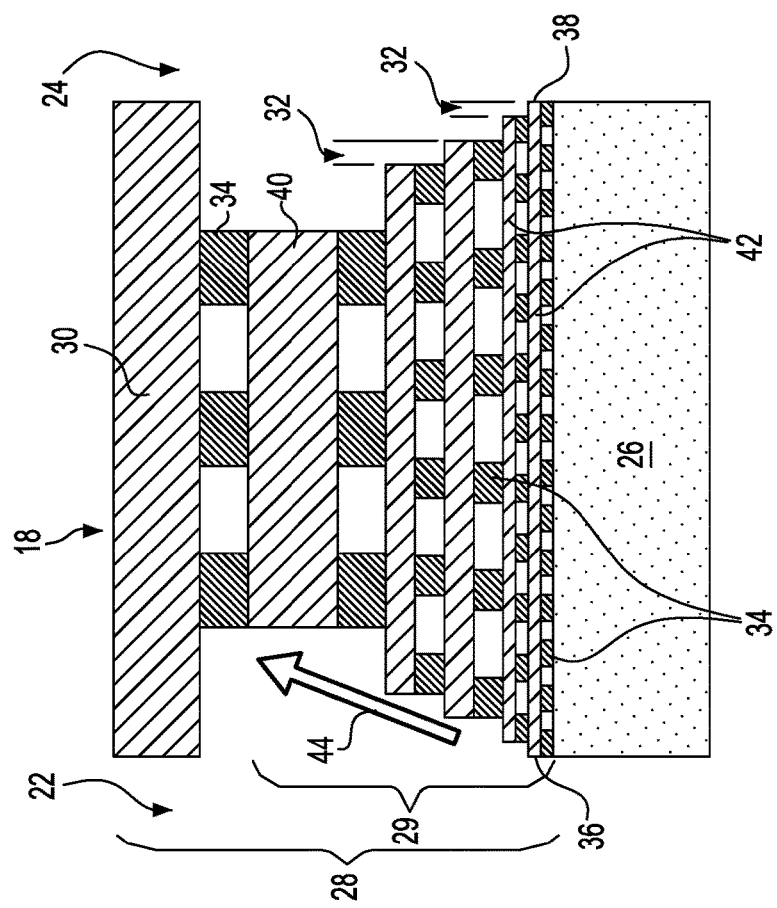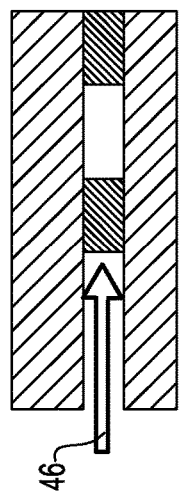

STEP PYRAMID SHAPED STRUCTURE TO REDUCE DICING DEFECTS

BACKGROUND

The present exemplary embodiments pertain to the manufacture of semiconductor devices and, more particularly, to a crack stop structure for mitigating crack formation in the semiconductor devices during singulation.

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Dozens or hundreds of semiconductor devices are typically manufactured on a single semiconductor wafer. The individual die are singulated by sawing the semiconductor devices along a scribe line in a kerf region. The individual die are then packaged, either separately or in a multi-chip module or other type of packaging, for example.

A problem that may occur in semiconductor devices is that when the die are singulated, the material layers can crack proximate the scribe line in the kerf region, damaging the integrated circuits within the semiconductor devices and leading to device failures. The cracks can disrupt conductive lines, for example, rendering the circuits inoperable. The cracks can also allow moisture and other contaminants to enter into the integrated circuit, causing corrosion, for example.

BRIEF SUMMARY

The various advantages and purposes of the exemplary embodiments as described above and hereafter are achieved by providing, according to an aspect of the exemplary embodiments, a semiconductor device comprising: a substrate having integrated circuits; and metallization layers on the substrate, the metallization layers having a peripheral region adjacent to a kerf region of the semiconductor device and containing a crack stop structure. The crack stop structure comprising: a bottom portion containing a plurality of the metallization layers connected by vias with each metallization layer decreasing in width in a step pyramid structure from a bottom of the bottom portion to a top of the bottom portion; and a top portion containing a top metallization layer of the metallization layers connected to the bottom portion, the top metallization layer being wider than a top-most metallization layer of the bottom portion and having a segment that extends toward the kerf region so as to create an overhang with respect to the bottom portion.

According to another aspect of the exemplary embodiments, there is provided a semiconductor device comprising: a substrate having integrated circuits; and metallization layers on the substrate, the metallization layers having a peripheral region adjacent to a kerf region of the semiconductor device and containing a crack stop structure. The crack stop structure comprising: a plurality of metallization layers connected by vias with each metallization layer decreasing in width in a step pyramid structure and a top metallization layer connected to the plurality of metallization layers in the step pyramid structure, the top metallization layer being wider than the top-most metallization layer in the step pyramid structure and having a segment that extends toward the kerf region so as to create an overhang with respect to the step pyramid structure.

According to a further aspect of the exemplary embodiments, there is provided a method of stopping cracks in a semiconductor device comprising a substrate having integrated circuits and metallization layers on the substrate, the method comprising: forming a peripheral region in the metallization layers adjacent to a kerf region of the semiconductor device; forming a crack stop structure comprising: a plurality of metallization layers connected by vias with each metallization layer decreasing in width in a step pyramid structure and a top metallization layer connected to the plurality of metallization layers in the step pyramid structure, the top metallization layer being wider than the top-most metallization layer in the step pyramid structure and having a segment that extends toward the kerf region so as to create an overhang with respect to the step pyramid structure; dicing the semiconductor device in the kerf region; and stopping any cracks extending from the kerf region by directing the cracks upward to an area encompassed by the step pyramid structure and the top metallization layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 2 is a cross sectional view of an exemplary embodiment of the crack stop structure in FIG. 1 in the direction of arrows A-A in FIG. 1.

FIG. 3 is a cross sectional view of the exemplary embodiment of the crack stop structure in FIG. 1 in the direction of arrows B-B in FIG. 1.

FIG. 4 is a cross sectional view of an undesirable arrangement of vias and adjacent metallization layers.

FIG. 5 is a cross sectional view of a preferred arrangement of vias and adjacent metallization layers.

DETAILED DESCRIPTION

Semiconductor devices include a semiconductor substrate in which the front end of the line components may be formed. On top of the semiconductor substrate may be formed metallization layers comprising alternating layers of metallization and insulation material. There is evidence to show that dicing-induced cracks propagate through a crack stop at the metallization layers which leads to electrical fails.

Dicing optimization to reduce initial crack formation is only a mitigation but not a solution.

The exemplary embodiments enhance the fracture toughness of the crack stop structure to stop a crack from propagating passed the crack stop structure.

Figure 1:
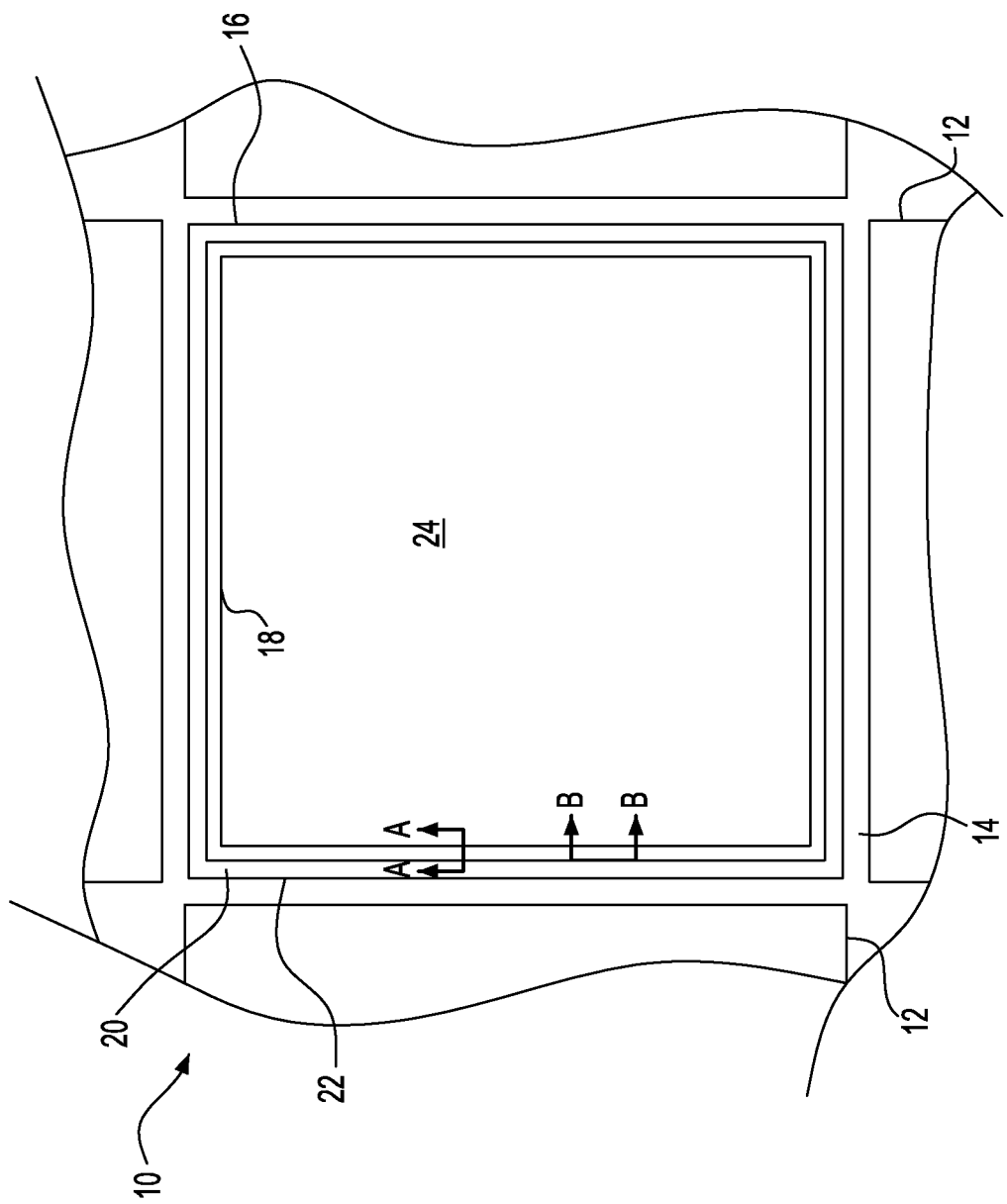
FIG. 1 is a plan view of a semiconductor device having a crack stop structure before singulation.

Referring to the Figures in more detail, and particularly referring to FIG. 1, there is shown a plan view of a partial semiconductor wafer 10 having a plurality of semiconductor devices 12. Located between the semiconductor devices 12 is a kerf region 14 through which the semiconductor devices 12 may be separated in a singulation process.

One particular semiconductor device 16 is shown with greater detail to illustrate a crack stop structure 18. The other semiconductor devices 12 may also have the crack stop structure 18 but the crack stop structure is not shown for clarity. The crack stop structure 18 preferably extends around the entire periphery of the semiconductor device 16 and preferably is continuous around the entire periphery of the semiconductor device 16. The purpose of the crack stop structure 18 is to stop the propagation of cracks and thus performs no electrical function.

There may be a space 20 between the crack stop structure 18 and the edges 22 of the semiconductor device 16. Located in the central portion 24 of the semiconductor device 16 are the integrated circuits which perform the electrical function of the semiconductor device 16 but are not shown here for clarity.

Referring now to FIG. 2, there is illustrated a cross sectional view of an exemplary embodiment of the crack stop 18 structure in FIG. 1 in the direction of arrows A-A in FIG. 1.

Semiconductor substrate 26 contains the front end of the line components and has a plurality of metallization layers 28. The crack stop structure 18 is located within the periphery of the semiconductor device 16 and is comprised of a peripheral portion of the metallization layers 28. Some metallization layers 29 of the metallization layers 28 form a step pyramid structure in which the edges 36 of the metallization layers 29 facing the edge 22 of the semiconductor device 16 are set back a predetermined distance 32 from the metallization layer 29 below as the step pyramid structure is progressed towards the top of the metallization layers 29. In the exemplary embodiment illustrated in FIG. 2, the step pyramid structure may be formed with the edges 36 of the metallization layers 29 facing the edge 22 of the semiconductor device 16 as well as the edges 38 of the metallization layers 29 facing the central portion 24 of the semiconductor device 16.

The predetermined distance 32 may change as the step pyramid is progressed upwardly. The predetermined distance 32 may be empirically determined. The toughening mechanism of the exemplary embodiments will be most effective if the grade of the step pyramid is perpendicular to the phase angle of the potential crack, which is typically between 40 degrees and 50 degrees, more preferably 40 degrees to 42 degrees. That being said, it will be desirable to keep the slope of the steps to the horizontal within 40 degrees to 50 degrees.

Each metallization layer 29 has a plurality of vias 34 spaced continuously from edge 36 to edge 38 of each metallization layer to provide fracture toughness to each metallization layer 29.

The crack stop structure 18 further includes a top metallization layer 30 which may connect to the metallization layers 29 of the step pyramid structure by additional vias 34. It is noted that top metallization layer 30, contrary to the other metallization layers 29, does not follow the step pyramid structure but rather extends toward the edge 22 of the semiconductor device 16 beyond the metallization layer 40 below so as to create an "overhang". Top metallization layer 30 may similarly have an "overhang" toward the central portion 24 of the semiconductor device 16. The vias 34 that connect top metallization layer 30 to metallization layer 40 may also be spaced continuously from edge 36 to edge 38 of metallization layer 40.

The purpose of the "overhang" of the top metallization layer 30 will now be discussed.

The lowest metallization layers, such as metallization layers 42, are the weakest metallization layers 28. In the exemplary embodiments, all of the metallization layers 28 have been reinforced by adding vias 34 all across the crack stop structure 18. Further, the crack stop structure 18 has been made in a step pyramid, except for top metallization layer 30, so that any crack approaching the crack stop structure 18 is directed upward as indicated by arrow 44 to the upper metallization layers 28, such as metallization layer 40, which are more robust than the lower metallization layers 28, such as metallization layers 42. In general, when a crack hits the crack stop structure 18 at a particular metallization layer, the region above this layer, the dielectric, is not reinforced while the region below this metallization layer is reinforced by the vias 34 arrayed across the crack stop structure 18. Accordingly, the crack will follow the weakest path which is upward as indicated by arrow 44.

While not wishing to be held to any particular theory, if the crack stop structure 18 is robust enough, it forms a compressive zone in the region adjacent to it, which may "shield" the crack front from actually reaching the crack stop structure 18. The upward path of the crack may eventually run into the top metallization layer 30, the corner bounded by the top metallization layer 30 and the adjacent metallization layer 40 which are joined by vias 34 or the metallization layer 40 by itself. However, it is likely that the crack may be prohibited from actually propagating into the top metallization layer 30, the corner or the metallization layer 40 by the compressive zone. The crack stop structure 18 has been engineered so as to be very robust at the top metallization layer 30, in this corner and at metallization layer 40 so that it is desirable to direct the potential crack towards them. Any crack that runs into the top metallization layer 30, this corner or metallization layer 40 would be effectively stopped.

FIG. 3 is a cross sectional view of the exemplary embodiment of the crack stop structure in FIG. 1 in the direction of arrows B-B in FIG. 1. It can be seen that the various metallization layers 28 are continuous. Further, the vias 34 are also continuous. The continuous vias 34 may also be referred to as via bars.

One way of connecting the vias to the adjacent metallization layers is to recess the vias from the edges of the two metallization layers. As shown in FIG. 4, such an arrangement is undesirable as a crack, indicated by arrow 46, could be trapped between the metallization layers, possibly leading to delamination of the metallization layers. Certainly, such an arrangement would be undesirable in the lower metallization layers, such as metallization layers 42 (FIG. 2), where the metallization layers are the weakest.

Contrarily, a feature of the exemplary embodiments is that with respect to the metallization layers 29 the outermost via is aligned with the edge of the metallization layer immediately above the via. Referring to FIG. 5, the via 34 is aligned with the edge of metallization layer 29B although the via also connects to the lower metallization layer 29A in the step pyramid construction of the exemplary embodiments. In this arrangement, a crack 47 is blocked by the robust structure of the metallization layers 29A, 29B and via 34 so the crack 47 is directed upwards.

Figure 6:
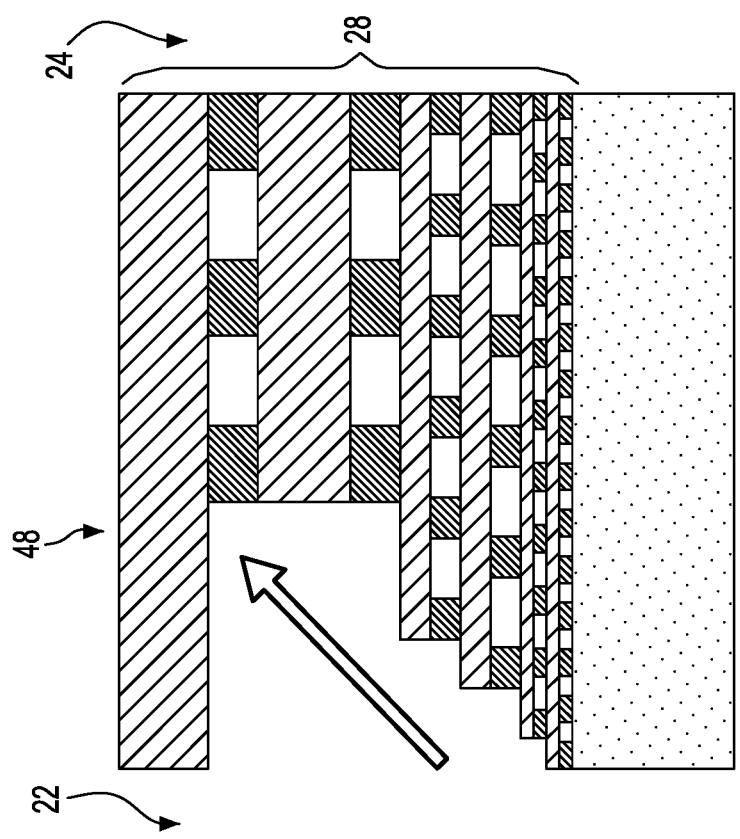
FIG. 6 is a cross sectional view of another exemplary embodiment of the crack stop structure in FIG. 1 in the direction of arrows A-A in FIG. 1.

FIG. 6 is a cross sectional view of another exemplary embodiment of the crack stop structure in FIG. 1. It is noted that the crack stop structure 18 illustrated in FIG. 2 is symmetrical in that the step pyramid structure is formed on both sides of the crack stop structure 18. In the FIG. 6 exemplary embodiment of crack stop structure 48, the step pyramid structure is formed only on one side of the crack stop structure 48, the side facing the edge 22 of the semiconductor device 16 while all of the metallization layers 28 are vertically aligned on the side facing the central portion 24 of the semiconductor device 16.

Figure 7:
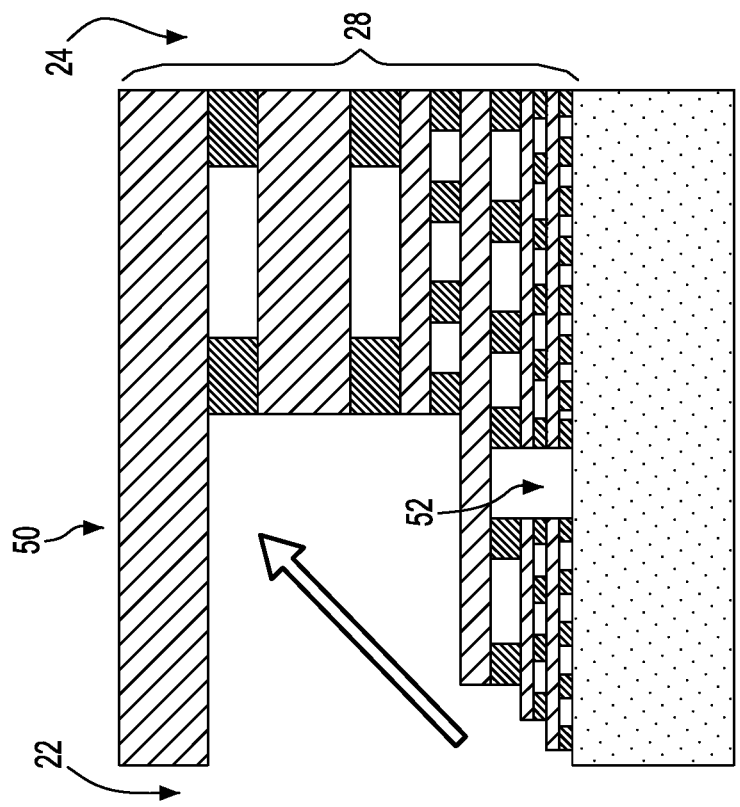
FIG. 7 is a cross sectional view of a further exemplary embodiment of the crack stop structure in FIG. 1 in the direction of arrows A-A in FIG. 1.

FIG. 7 is a cross sectional view of a further exemplary embodiment of the crack stop structure in FIG. 1. In the FIG. 7 exemplary embodiment of crack stop structure 50, the step pyramid structure is formed only on one side of the crack stop structure 50, the side facing the edge 22 of the semiconductor device 16 while all of the metallization layers 28 are vertically aligned on the side facing the central portion 24 of the semiconductor device 16. In addition, there is a gap 52 in at least one of the bottom metallization layers 42.

Figure 8:
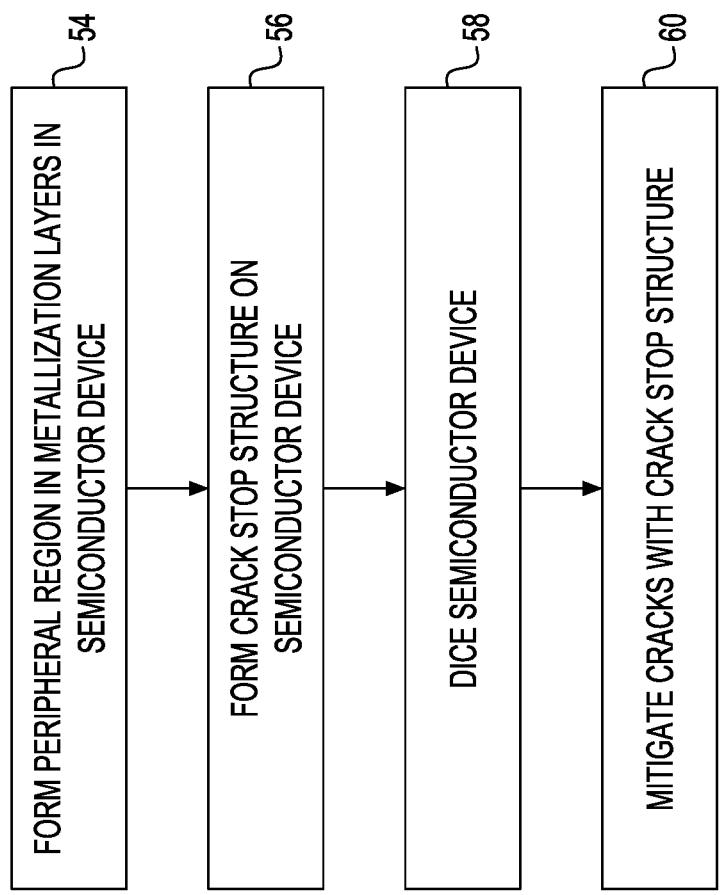
FIG. 8 is an illustration of a method of the exemplary embodiments.

Referring now to FIG. 8, there is illustrated a method of stopping cracks in a semiconductor device comprising a substrate having integrated circuits and metallization layers on the substrate.

The method includes a peripheral region formed in the metallization layers adjacent to a kerf region of the semiconductor device, box 54.

A crack stop structure is formed on the semiconductor device, box 56. The crack stop structure includes: a plurality of metallization layers connected by vias with each metallization layer decreasing in width in a step pyramid structure and a top metallization layer connected to the plurality of metallization layers in the step pyramid structure, the top metallization layer being wider than the top most metallization layer in the step pyramid structure and having a segment that extends toward the kerf region so as to create an overhang with respect to the step pyramid structure;

The semiconductor device is diced in the kerf region, box 58.

Any cracks extending from the kerf region are stopped by directing the cracks upward to an area encompassed by the step pyramid structure and the top metallization layer, box 60.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor device comprising:
    a substrate having integrated circuits;
    metallization layers on the substrate, the metallization layers having a peripheral region adjacent to a kerf region of the semiconductor device and containing a crack stop structure comprising:
    a bottom portion containing a plurality of the metallization layers connected by vias with each metallization layer decreasing in width in a step pyramid structure from a bottom of the bottom portion to a top of the bottom portion; and
    a top portion containing a top metallization layer of the metallization layers connected to the bottom portion, the top metallization layer being wider than a top-most metallization layer of the bottom portion and having a segment that extends toward the kerf region so as to create an overhang with respect to the bottom portion;
    wherein the vias that connect each metallization layer to an adjacent metallization layer are spaced entirely across each metallization layer immediately above the vias.

2. The semiconductor device of claim 1 wherein the outermost via on each metallization layer of the bottom portion is aligned with an edge of the metallization layer immediately above the outermost via.

3. The semiconductor device of claim 1 wherein all metallization layers are symmetrically aligned such that each metallization layer is situated above a middle of the metallization layer immediately below.

4. The semiconductor structure of claim 1 wherein the crack stop structure is continuous around the entire periphery of the semiconductor device.

5. The semiconductor structure of claim 1 wherein the crack stop structure is electrically inoperable.

6. A semiconductor device comprising:
    a substrate having integrated circuits;
    metallization layers on the substrate, the metallization layers having a peripheral region adjacent to a kerf region of the semiconductor device and containing a crack stop structure comprising:
    a bottom portion containing a plurality of the metallization layers connected by vias with each metallization layer decreasing in width in a step pyramid structure from a bottom of the bottom portion to a top of the bottom portion; and
    a top portion containing a top metallization layer of the metallization layers connected to the bottom portion, the top metallization layer being wider than a top-most metallization layer of the bottom portion and having a segment that extends toward the kerf region so as to create an overhang with respect to the bottom portion;
    wherein all metallization layers in the bottom portion have the step pyramid structure only on a side facing the kerf and are vertically aligned with the top metallization layer on a side facing away from the kerf.

7. The semiconductor structure of claim 6 wherein at least one metallization layer in the bottom portion is discontinuous.

8. A semiconductor device comprising:
    a substrate having integrated circuits;
    metallization layers on the substrate, the metallization layers having a peripheral region adjacent to a kerf region of the semiconductor device and containing a crack stop structure comprising:
    a plurality of metallization layers connected by vias with each metallization layer decreasing in width in a step pyramid structure and a top metallization layer connected to the plurality of metallization layers in the step pyramid structure, the top metallization layer being wider than the top-most metallization layer in the step pyramid structure and having a segment that extends toward the kerf region so as to create an overhang with respect to the step pyramid structure;
    wherein the vias that connect each metallization layer to an adjacent metallization layer are spaced entirely across each metallization layer immediately above the vias.

9. The semiconductor device of claim 8 wherein the outermost via on each metallization layer in the step pyramid structure is aligned with an edge of the metallization layer immediately above the outermost via.

10. The semiconductor device of claim 8 wherein all metallization layers are symmetrically aligned such that each metallization layer is situated above a middle of the metallization layer immediately below.

11. The semiconductor structure of claim 8 wherein the crack stop structure is continuous around the entire periphery of the semiconductor device.

12. The semiconductor structure of claim 8 wherein the crack stop structure is electrically inoperable.

13. A semiconductor device comprising:
a substrate having integrated circuits;
metallization layers on the substrate, the metallization layers having a peripheral region adjacent to a kerf region of the semiconductor device and containing a crack stop structure comprising:
a plurality of metallization layers connected by vias with each metallization layer decreasing in width in a step pyramid structure and a top metallization layer connected to the plurality of metallization layers in the step pyramid structure, the top metallization layer being wider than the top-most metallization layer in the step pyramid structure and having a segment that extends toward the kerf region so as to create an overhang with respect to the step pyramid structure;
wherein all metallization layers in the step pyramid structure have the step pyramid structure only on a side facing the kerf and are vertically aligned with the top metallization layer on a side facing away from the kerf.

14. The semiconductor structure of claim 13 wherein at least one metallization layer in a bottom portion of the step pyramid structure is discontinuous.

15. A method of stopping cracks in a semiconductor device comprising a substrate having integrated circuits and metallization layers on the substrate, the method comprising:
forming a peripheral region in the metallization layers adjacent to a kerf region of the semiconductor device;
forming a crack stop structure comprising:
a plurality of metallization layers connected by vias with each metallization layer decreasing in width in a step pyramid structure and a top metallization layer connected to the plurality of metallization layers in the step pyramid structure, the top metallization layer being wider than the top-most metallization layer in the step pyramid structure and having a segment that extends toward the kerf region so as to create an overhang with respect to the step pyramid structure, wherein the vias that connect each metallization layer to an adjacent metallization layer are spaced entirely across each metallization layer immediately above the vias;
dicing the semiconductor device in the kerf region; and
stopping any cracks extending from the kerf region by directing the cracks upward to an area encompassed by the step pyramid structure and the top metallization layer.

16. The method of claim 15 wherein the crack stop structure is continuous around the entire periphery of the semiconductor device.

17. The method of claim 15 wherein the crack stop structure is electrically inoperable.

18. The method of claim 15 wherein the outermost via on each metallization layer in the step pyramid structure is aligned with an edge of the metallization layer immediately above the outermost via.

* * * * *